United States Patent
Lesso

(10) Patent No.: US 7,295,053 B2
(45) Date of Patent: Nov. 13, 2007

(54) DELAY-LOCKED LOOP CIRCUITS

(75) Inventor: John Paul Lesso, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 0 days.

(21) Appl. No.: 11/406,323

(22) Filed: Apr. 19, 2006

(65) Prior Publication Data

US 2007/0176656 A1    Aug. 2, 2007

(30) Foreign Application Priority Data

Feb. 1, 2006    (GB) .............................. 0601973.1

(51) Int. Cl.
*H03L 7/06* (2006.01)
(52) U.S. Cl. ...................... 327/158; 327/155; 327/156; 327/159; 327/161; 327/162; 327/163
(58) Field of Classification Search ................ 327/158, 327/148–150, 161, 162, 155–157, 159, 163
See application file for complete search history.

(56) References Cited

U.S. PATENT DOCUMENTS

| | | | |
|---|---|---|---|
| 5,120,990 A | | 6/1992 | Koker |
| 5,663,665 A * | | 9/1997 | Wang et al. ................... 327/3 |
| 5,926,047 A | | 7/1999 | Harrison |
| 6,043,677 A | | 3/2000 | Albu et al. |
| 6,060,902 A | | 5/2000 | Albu et al. |
| 6,100,736 A | | 8/2000 | Wu et al. |
| 6,239,634 B1 * | | 5/2001 | McDonagh ................. 327/158 |
| 6,667,643 B2 * | | 12/2003 | Ko ............................. 327/158 |
| 6,680,634 B1 | | 1/2004 | Ruha et al. |
| 7,157,949 B2 * | | 1/2007 | Chen et al. ................. 327/158 |
| 2003/0218488 A1 | | 11/2003 | Kwak |
| 2003/0234669 A1 | | 12/2003 | Foley et al. |
| 2004/0000937 A1 | | 1/2004 | Byun et al. |
| 2004/0008063 A1 | | 1/2004 | Kim et al. |
| 2004/0041605 A1 | | 3/2004 | Kizer |
| 2004/0201425 A1 | | 10/2004 | Lesso |

OTHER PUBLICATIONS

Takanori Saeki et al: "A 1.3-Cycle Lock Time, Non-PLL/DLL Clock Multiplier Based on Direct Clock Cycle Intepolation for "Clock on Demand"", IEEE Journal of Solid State Circuits, vol. 35, No. 11 (Nov. 2000). 1581-1590.

Zeljko Zllic: "Phase- and Delay-Locked Loop Clock Control in Digital Systems" TechOnLine Publication Date: Aug. 17, 2001: McGill University. Montreal.

* cited by examiner

*Primary Examiner*—Linh My Nguyen
*Assistant Examiner*—Patrick O'Neill
(74) *Attorney, Agent, or Firm*—Dickstein Shapiro LLP

(57) ABSTRACT

A delay-locked loop (DLL) circuit comprises a voltage controlled delay line (VCDL) including a plurality of identical delay stages connected in series, and a feedback loop including a phase comparator for controlling the VCDL such that the total delay over a number of stages matches the period of the periodic reference signal. Signal outputs are connected to derive their respective output signals from respective nodes within the delay line. The phase comparator compares the phase of first and second differently delayed versions of the reference signal from respective nodes within the variable delay line separated only by a plurality of identical delay stages.

39 Claims, 5 Drawing Sheets

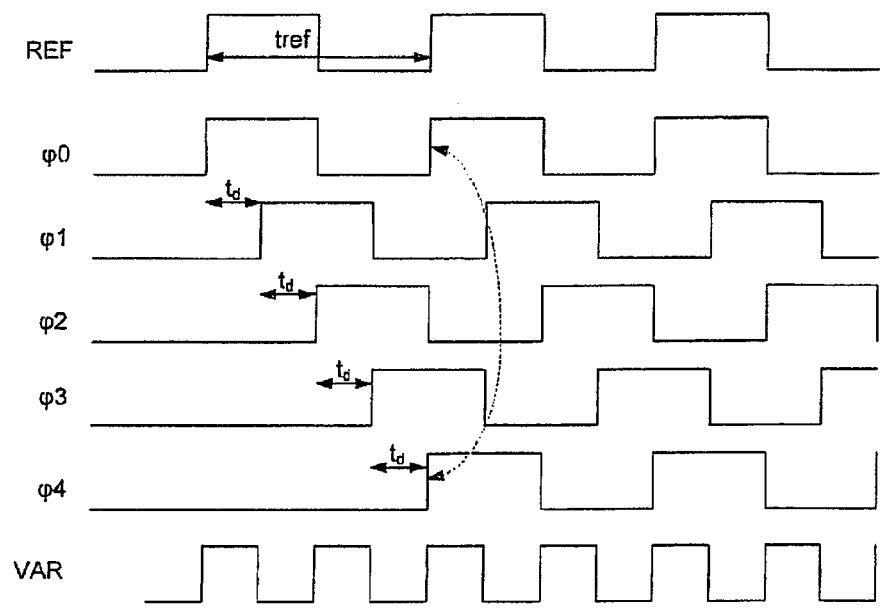
Fig. 4 (a) (IDEAL)
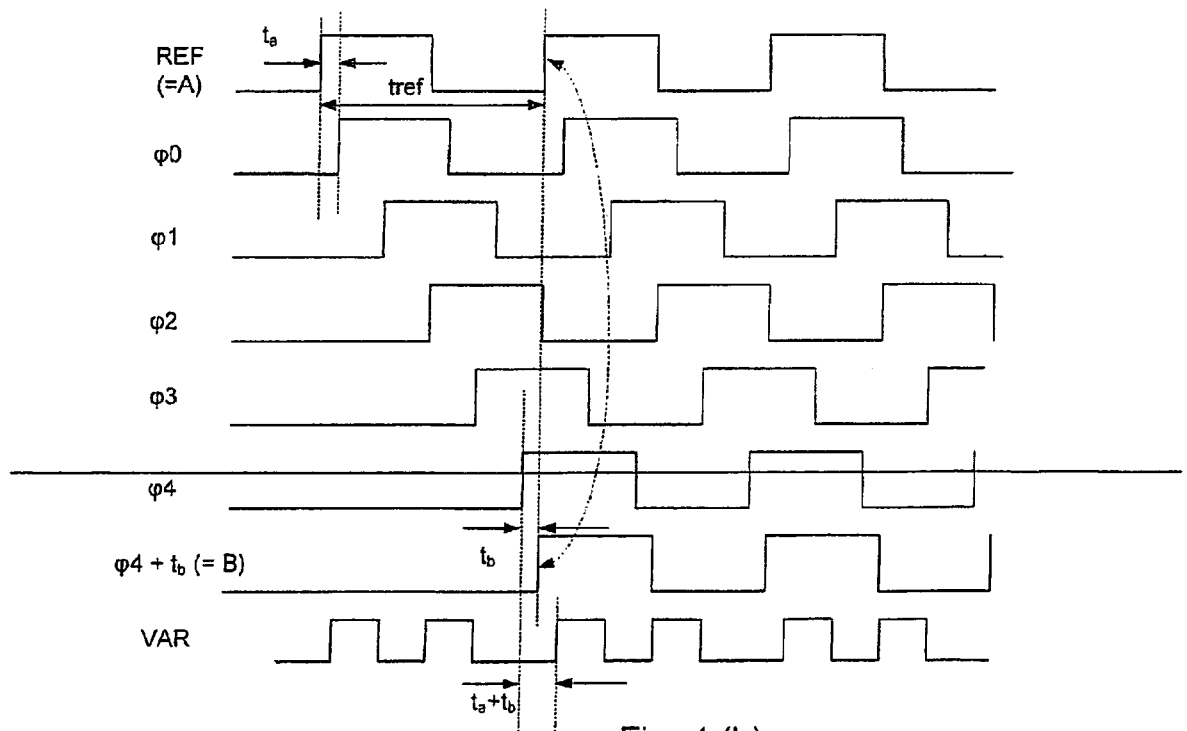
Fig. 4 (b) (ACTUAL)

DELAY-LOCKED LOOP CIRCUITS

PRIOR APPLICATION DATA

The present application claims priority from prior GB application 0601973.1 filed 1 Feb. 2006, incorporated herein by reference in its entirety.

FIELD OF THE INVENTION

The present invention relates to delay locked-loop (DLL) circuits, that is circuits for receiving a reference clock waveform and for generating a plurality of output waveforms synchronised with said reference waveform and having predetermined phase relationships with one another.

BACKGROUND

Delay-locked loop (DLL) circuits are known for generating clock signals for use locally in a larger circuit, based on a received reference or master clock. After a start-up phase in which lock is achieved, the generated signals are phase aligned with the reference signal. Conversely, Phase-locked loops (PLLs) can multiply or divide frequency by any number and provide a 'flywheel' effect to reduce jitter, but are correspondingly slower to lock. DLLs often have a faster locking behaviour which makes them suited for use in power-sensitive applications, where the clocks to different circuit blocks are enabled and disabled from time to time, according to need. Unlike PLLs, DLLs can be used for integer clock multiplication only (e.g. ×1, ×2, ×3 etc.) and do not attenuate the jitter on the input. However, due to the fact there are fewer thermal noise sources that in a PLL, the DLL is capable of producing a higher quality clock that a PLL. Hence their use is primarily limited to two situations:

i) a system where the input clock is of high performance and the multiplied clock must also be of high quality, such as high quality audio applications; and ii) a system where clock multiplication is required but there is no need to attenuate the jitter on the clock, such as DSP chips.

DLLs are based on a variable multi-stage delay line, in which the delay is controlled by a phase/frequency detector which compares the signal at the end of the delay line with the reference signal. Taps between stages in the delay line provide multiple copies of the reference signal, phase shifted so as to subdivide the clock period. These copy signals can be used individually, for example to provide a pair of clock signals in quadrature at the same frequency as the reference clock, and/or combined in a circuit to generate a frequency multiplied clock waveform. Examples of known DLL circuits can be seen in US 2004/0008063 A1 (Kim et al) and U.S. Pat. No. 6,100,736 (Wu et al).

SUMMARY

The inventor has recognised that known DLL circuits such as clock multipliers are very sensitive to additional delays in the loop which, can act to introduce duty cycle distortion and hence modulation on the output clocks. Depending on the design of the subsequent circuitry, wrong frequency output signals may even result. Other areas of concern associated with DLLs are start-up issues such as false locking and harmonic locking. Different aspects of the invention aim to address these different problems to enable the provision of a simple, yet wide-ranging and accurate DLL circuit.

The invention in a first aspect provides a delay-locked loop (DLL) circuit having a reference signal input for a receiving a periodic reference signal and at least two signal outputs for outputting respective output signals derived from the reference signal and having a desired phase relationship with one another, the DLL circuit comprising:

(a) a variable delay line comprising a plurality of nominally identical delay stages connected in series, the delay at each stage being adjustable in response to a delay control signal, the delay line including an input node of the first of said identical stages, one or more intermediate nodes at which the output of one of said identical stages is coupled to the input of a next stage, and an end node comprising the output of a last one of said identical stages in the delay line;

(b) a delay line input path for feeding said periodic reference signal to the input node of the delay line;

(c) a plurality of delay line output paths for deriving said output signals from respective ones of said nodes; and (d) a feedback control arrangement including a phase comparator and delay control signal generator for generating said delay control signal and applying it to the variable delay line such that the total delay over a number of said stages corresponds in a known manner to a period of the periodic reference signal, wherein said signal outputs are connected to derive their respective output signals from respective ones of said nodes within said delay line, and wherein said phase comparator is arranged to receive and compare the phase of first and second differently delayed versions of the reference signal which are both derived via respective output paths from respective nodes within the variable delay line, said nodes being separated only by a plurality of identical delay stages.

By this arrangement, any delay in the input path to the delay line is taken outside the feedback loop and the total delay over the intervening stages becomes exactly matched to the period of the reference signal, independent of the input path delay. Moreover, the paths from the nodes providing the first and second delayed versions of the reference signal can be matched so that their delays are effectively cancelled and delay line divides the reference period into equal intervals.

Said paths may include respective buffer circuits for deriving signals from said nodes as defined, while isolating said nodes from loading by inputs of circuits receiving said signals.

The delay line input path may comprise a delay line input buffer connected to receive said periodic reference signal and apply it to said delay line input node. The first delayed version of the reference signal may be derived from the delay line input node itself.

The delay line input buffer may comprise a variable delay stage similar to those within the variable delay line itself and connected to receive the same delay control signal. This allows optimum matching of delays within the critical stages of the delay line.

Alternatively, the delay line input buffer may be a normal buffer and so may impose a different, possibly much shorter, delay than the subsequent delay stages.

At least one of said output signals may be derived via the same output path as one of the first and second delayed versions of the reference signal.

Said outputs may be derived via delay line output paths matched to the output paths for the signals fed to the phase comparator.

In a preferred embodiment, all of said outputs are derived from nodes equal to or intermediate between the nodes from which said first and second delayed versions of the reference signal are derived. By deriving two output signals from the input node and a node a quarter way along the delay line, for example, quadrature copies of the reference signal can be obtained.

The delay stages in the delay line may be inverting or non-inverting. The latter will generally allow better matching between delay stages, whereas the former may allow faster operation for a given technology of implementation. They may also be differential stages, that is with pairs of differential input and output terminals.

The DLL circuit may include means for varying the selection of the nodes from which said first and second versions of the reference signal are derived, thereby to vary the number of delay stages corresponding to the reference signal period.

The manner in which the total delay over said number of stages corresponds to the period of the reference signal will typically be by matching the period itself. If desired, however, the total delay may equal half of the reference signal period, or even a multiple of it.

The DLL circuit may further comprise start-up control circuitry arranged to receive a pre-start signal and to modify the delay control signal so as to minimise the delay of the variable delay line prior to starting operation. This measure permits a wide range of delays to be allowed while eliminating the problem of harmonic locking.

The DLL circuit may further comprise start-up control circuitry arranged to cause said phase comparator to ignore a first transition in the first version of the reference signal in determining the relative order of transitions in the first and second versions of the reference signal. This function and that of the preceding paragraph may both be provided in a single DLL circuit. Typically the phase comparator will be responsive only to transitions in a particular direction (positive-going or negative-going edges). In such a case, the phrase "first transition" refers to the first transition of the relevant type, rather than the first transition of any type.

The feedback control arrangement may further comprise stop detection circuitry for detecting automatically interruptions in said periodic reference signal and maintaining said delay control signal substantially constant during said interruptions.

Said stop detection circuitry may comprise a logic circuit combining a plurality of said output signals from the delay line.

The DLL circuit may further comprise a waveform synthesiser for receiving said output signals having their predetermined phase relationship and for responding to transitions in said output signals to generate a synthesised periodic waveform with a frequency determined by said reference signal. It is noted that the phase relationship between the reference signal and the first delayed version of the reference signal is outside the control loop. However, in practice, the phase relationship between the synthesised waveform(s) and the reference signal may also be well-defined, and can be engineered to be so if this relationship is of concern. The synthesised waveform may have a frequency which is a multiple of the frequency of the periodic reference signal.

The waveform synthesiser may be arranged to generate a second synthesised waveform having a predetermined phase relationship to the first synthesised waveform.

The invention in the first aspect further provides a method of operating a delay-locked loop (DLL) circuit, the method comprising:
(a) providing a variable delay line comprising a plurality of nominally identical delay stages connected in series, the delay at each stage being adjustable, the delay line including an input node of the first of said identical stages, one or more intermediate nodes at which the output of one of said identical stages is coupled to the input of a next stage, and an end node comprising the output of a last one of said identical stages in the delay line;
(b) receiving a periodic reference signal and feeding said periodic reference signal via a delay line input path for to the input node of the delay line;
(c) deriving from respective ones of said nodes a plurality of output signals having a desired phase relationship with one another; and
(c) controlling the delays of the stages within the variable delay line automatically such that the total delay over a number of said stages corresponds in a known manner to a period of the periodic reference signal,
wherein said controlling step (c) is performed by comparing the phase of first and second differently delayed versions of the reference signal which are both derived via respective output paths from respective nodes within the variable delay line, said nodes being separated only by a plurality of identical delay stages.

Specific preferred embodiments of the method can be envisaged in the same manner as the embodiments of the circuit described above According to a second aspect of the invention, there is provided a delay-locked loop (DLL) circuit having a reference signal input for a receiving a periodic reference signal, the DLL circuit comprising:
(a) a variable delay line comprising a plurality of delay stages connected in series, a first stage being arranged to receive the reference signal from said reference signal input, the delay at each stage being adjustable in response to a delay control signal;
(b) a phase comparator arranged to receive first and second versions of said reference signal, at least the second version being delayed via said delay line, the phase comparator responding to the relative order of transitions in said first and second versions to indicate the polarity of a phase error between them; and
(c) a delay control signal generator responsive to said phase error indication for modifying the delay control signal applied to the variable delay line so as to counter the indicated phase error,
wherein the DLL circuit further comprises start-up control circuitry arranged (i) to receive a pre-start signal and to modify the delay control signal so as to minimise the delay of the variable delay line prior to starting operation and (ii) to cause said phase comparator to ignore a first transition in the first version of the reference signal in determining the relative order of transitions in the first and second versions of the reference signal.

By these measures (i) and (ii), the invention in the second aspect eliminates a potential source of false locking problems, and also harmonic locking, allowing a wider range of delay variation without requiring complicated pre-setting of the delay. These measures can be implemented very simply, whereas known design techniques to eliminate these problems are more elaborate.

In an embodiment wherein the control signal is modified by pumping charge into and out of a capacitor, said pre-start charging path may be activated by said pre-start signal.

The invention in the second aspect further provides a method of starting a delay-locked loop (DLL) circuit in response to a periodic reference signal, the DLL circuit comprising:

(a) a variable delay line comprising a plurality of delay stages connected in series, a first stage being arranged to receive the reference signal from said reference signal input, the delay at each stage being adjustable in response to a delay control signal, (b) a phase comparator arranged to receive first and second versions of said reference signal, at least the second version being delayed via said delay line, the phase comparator responding to the relative order of transitions in said first and second versions to indicate the polarity of a phase error between them; and (c) a delay control signal generator responsive to said phase error indication for modifying the delay control signal applied to the variable delay line so as to counter the indicated phase error, the phase comparator and delay control signal generator together forming a feedback control circuit, the start-up method comprising the steps of (i) prior to operation of said feedback control circuit, modifying the delay control signal so as to minimise the delay of the variable delay line and (ii) upon commencing operation of said feedback control circuit, causing said phase comparator to ignore a first transition in the first version of the reference signal in determining the relative order of transitions in the first and second versions of the reference signal.

These and other features and aspects of the invention will be better understood from a consideration of the embodiments described below.

BRIEF DESCRIPTION OF THE DRAWINGS

Embodiments of the invention will now be described, by way of example only, by reference to the accompanying drawings, in which:

FIG. 4(a) shows ideal waveforms in the circuit of FIG. 1, while FIG. 4(b) shows actual waveforms taking into account various delays in the circuit;

DETAILED DESCRIPTION

Figure 1:
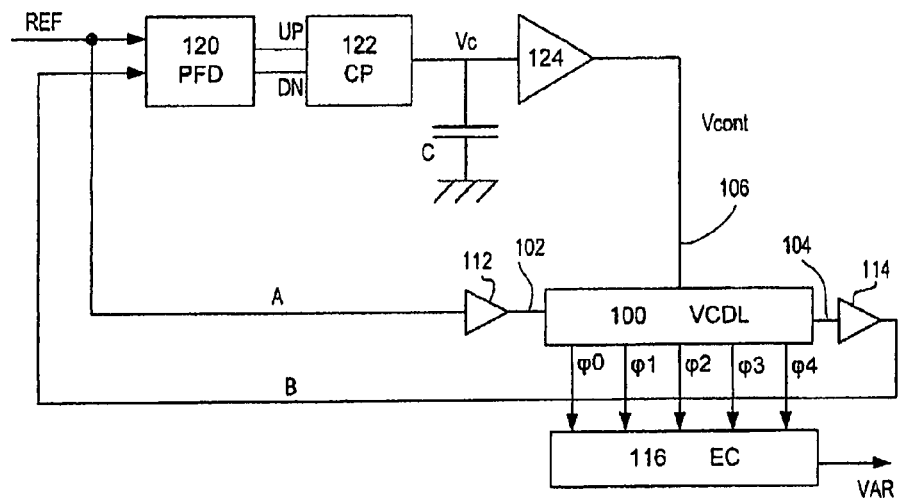
FIG. 1 is a block schematic diagram form a conventional DLL circuit, including in this example a waveform synthesiser at its output for doubling the frequency of a reference clock signal.

FIG. 1 shows a conventional delay-locked loop (DLL) circuit based on a voltage-controlled delay line (VCDL) 100 having an input node 102, a final output node 104, and five intermediate phase outputs nodes labelled φ0 to φ4. VCDL 100 also has an analogue control voltage input 106. In a practical implementation, VCDL signal input node 102 is driven by a buffer 112 and output node 104 drives a buffer 114, to interface between general digital signal levels and the variable signal levels within the VCDL. (This will be described in more detail below, with reference to FIG. 2.) A reference clock signal REF (from off-chip or from another part of the chip, for example) is fed to the input of buffer 112 (point A) and hence through VCDL 100. Intermediate phase outputs φ0 to φ4 are fed in parallel to a waveform synthesiser, or edge combiner, 116 which generates an output clock signal VAR. In this example, VAR is a clock waveform synchronised with REF but having twice the frequency.

The DLL control loop comprises a phase frequency detector PFD 120 which receives at one input the reference clock REF and at another input the signal from the output of buffer 114 (point B). A charge pump 122 is connected to receive 'up' and 'down' outputs UP and DN of the PFD and has an output connected to charge a capacitor C in a controlled manner. Analogue buffer 124 converts voltage $V_C$ on the capacitor into a delay control signal Vcont to the delay line 100, completing the loop. The internal functions of VCDL 100 and Edge combiner 116 will be described briefly, before the overall operation of the DLL circuit and the problems addressed are described. (The design of PFD circuits is well-known, with examples being shown in US 2004/0201425 A, mentioned above.)

Figure 2:
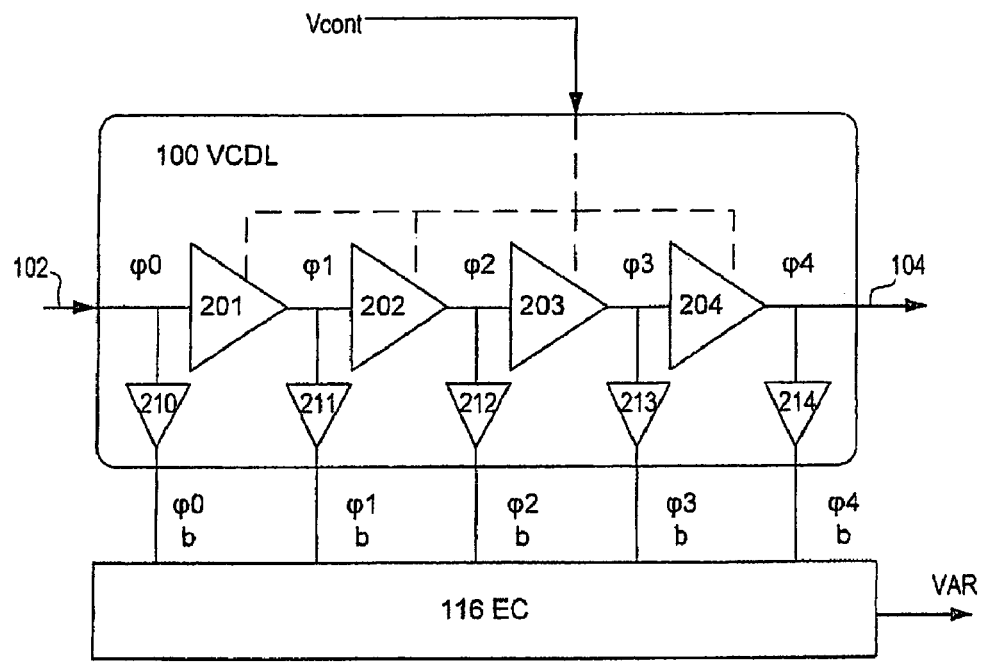
FIG. 2 shows in block schematic form the internal structure of a voltage-controlled delay line in the circuit of FIG. 1.

FIG. 2 shows in more detail the structure of the VCDL 100. This comprises a serial connection of four voltage-controlled delay stages 201-204, each as identical as practicable to the others, and each receiving the same delay control signal Vcont from the control loop buffer 108 (FIG. 1). The delay stages are drawn as simple buffers, and can be implemented very simply using modified CMOS inverters. Detailed design of the VCDL stages is not part of the present invention. One option for this implementation is to provide CMOS inverters whose supply rails are $V_{ss}$ and $V_{cont}$ instead of the full logic supply levels $V_{ss}$ and $V_{dd}$. As $V_{cont}$ decreases more and more relative to its maximum level, each stage takes longer to charge the input capacitance of the next stage, and the delay incurred at each stage 201-204 increases. In another implementation, the supply $V_{dd}$ can be connected to each stage via a constant current source mirrored from the delay control signal $V_{cont}$. The delay control signal could be a voltage or a current in practice, or even a digital signal. Further examples are illustrated in the Kim et al publications mentioned above, for example. Starving the supply voltage or current only on one side of the inverter may result in the transition in at least one direction still happening more cleanly and quickly than in the other. In such a case, the "good" edge can be used as the output signal for timing purposes.

Additional level shifting buffers 210-214 are provided at the VCDL outputs (edge combiner inputs), in order that the finely controlled, equal delays are not distorted by loading in the circuits of the edge combiner 116. Connecting output node 104 (signal φ4) directly to the input of PFD 120, for example, would mean that the loading on the output of delay stage 204 was different to that on the other stages, and the delay between φ3 and φ4 would be different (probably longer than) the delays φ1-φ2 and φ2-φ3. Therefore buffered versions φ0b to φ4b are generated. This is the reason also for the provision of input and output buffers 112 and 114 shown in FIG. 1.

Figure 3:
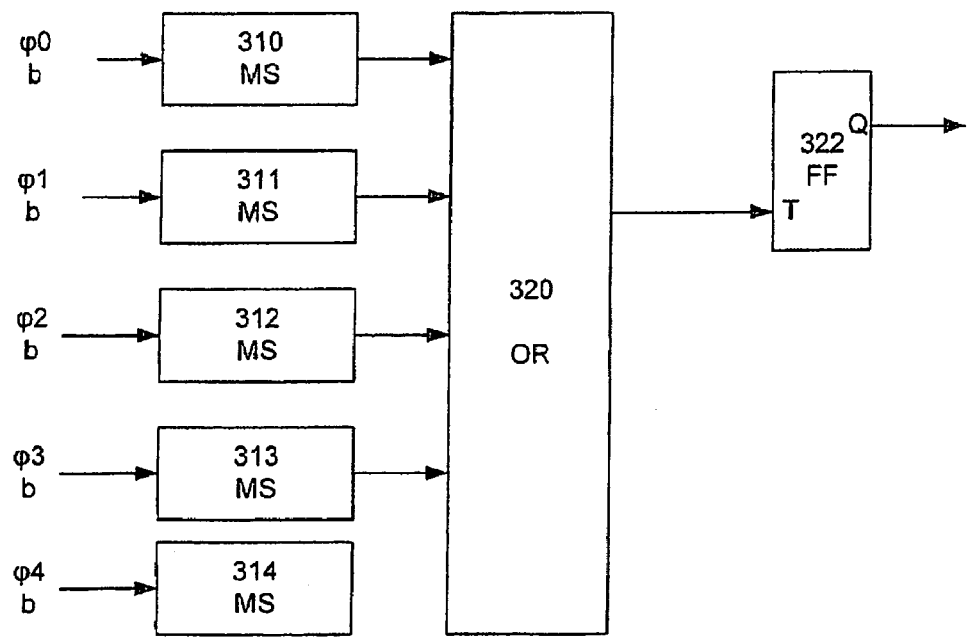
FIG. 3 shows in block schematic form the internal structure of one possible edge combiner in the circuit of FIG. 1.

FIG. 3 shows in more detail an example of the edge combiner 116. This circuit is configured to generate an output clock VAR which is twice the frequency of the input clock REF. It should be appreciated that the invention is not particularly concerned with any specific form or function of the edge combiner, and this one is presented as an illustrative example only. Each intermediate phase signal φ0b to φ4b is fed to the input of a respective monostable multivibrator 310-314 which will each generate a short pulse in response to every respective positive edge on the phase signal. These pulses are combined in an OR circuit 320 and the result is fed to the toggle input of a toggle flip-flop 322. The output of the flip-flop forms the signal VAR. It will be seen that the function of this circuit is simply to toggle the output signal every time any of the intermediate phase signals shows a rising edge. The period of the monostable output pulses is designed to be much shorter than the clock period and much shorter than the minimum stage delay. It will be noted that φ0b to φ3b only are actually connected into the OR gate. In the example illustrated, φ0 and φ4 should be more or less identical and so their resulting pulses would coincide if the circuit is working ideally. If it is not working ideally, then connecting both φ0 and φ4 to the OR circuit might result in extra pulses, which is undesirable. Nevertheless, the unused phase can be connected to a dummy monostable multivibrator input, as shown, to optimise matching of delay characteristics between all the stages.

Referring now to FIGS. 1 to 3 and the waveform diagram FIG. 4A, the basic operation of the DLL circuit will be explained. Signal B is essentially a delayed version of the signal at A. Depending on the phase & frequency relationship between the signals at its inputs, PFD 120 generates 'up' and 'down' pulses causing charge pump 122 to increase or decrease the charge, and hence the voltage $V_C$ on capacitor C. The size of each charge increment relative to the size of the capacitor is designed such that the loop incorporates a desired low-pass response to changes in phase and frequency of the signals at A and B. Through control of the voltages $V_C$ and $V_{cont}$, this feedback loop varies the delay $t_d$ in each stage of the delay line until the total delay between point A and point B is exactly equal to one clock period ($t_{ref}$) of the reference signal.

FIG. 4(a) shows idealised waveforms present in operation of the DLL circuit, assuming the delays are matched to the reference signal. Propagation delays, except for the controlled delays $t_d$ at each stage of VCDL 100, are ignored in this idealised view. The first signal shown is the reference clock signal REF. Within the VCDL 100, intermediate phase signals φ0 to φ4 are shown, each being a copy of REF delayed by an amount $t_d$ relative to the last. The broken arcuate arrow shows the edges at points A and B which are detected and phase aligned by action of the DLL. Since all the delays $t_d$ are made as equal as possible, and the total delay is controlled to match the period of REF, the positive edges in these intermediate waveforms are staggered so as to divide the clock period $t_{ref}$ into four equal sub-periods. These edges, triggering the toggle flip-flop in the edge combiner 116, cause the DLL circuit as a whole to output fast clock signal VAR, synchronised at double the frequency with the input signal REF. The term 'synchronised' in this context implies that two signals are in a substantially fixed time relationship, rather than strictly simultaneous.

The ideal waveforms shown in FIG. 4(a) can be obtained only if propagation delays $t_a$ and $t_b$ which are incurred through the VCDL input and output buffers 112 and 114 respectively are negligible in comparison with the stage delay $t_d$. It can be seen from FIG. 1 that the delay between points A and B is not merely $N*t_d$, where N is the number of stages in VCDL 100, but is rather equal to:

$$t_{AB} = t_a + t_b + N*t_d$$

Since it is this delay that the control loop matches to $t_{ref}$, then the delay through the VCDL is actually:

$$t_{\phi 0-4} = t_{AB} - t_a - t_b = t_{ref} - t_a - t_b$$

FIG. 4(b) shows the effect of this on the various waveforms, taking into account non-negligible values of $t_a$ and $t_b$. The edges in intermediate phase waveforms φ0 to φ4 are no longer spaced so as to sub-divide the reference clock period equally. Instead, they are compressed toward the first edge of φ0 in each clock period, to allow for an additional delay equal to $t_a+t_b$ before the cycle of edges can repeat. The frequency-doubled output clock VAR therefore suffers from duty cycle distortion, in that it includes pulses which for the most part are shorter than intended, and periodically includes a long pulse to compensate. If this clock is used to operate logic circuits running at the limit of their design, shortening the clock pulses threatens their reliable operation. Moreover, the periodic variation in pulse width also introduces undesirable tones on the output spectrum. This can degrade operations of certain circuits, such as audio converters. Depending on the design of the edge combiner, one could also end up with a time varying frequency in the output due to missing edges in the generated clock.

Figure 5:
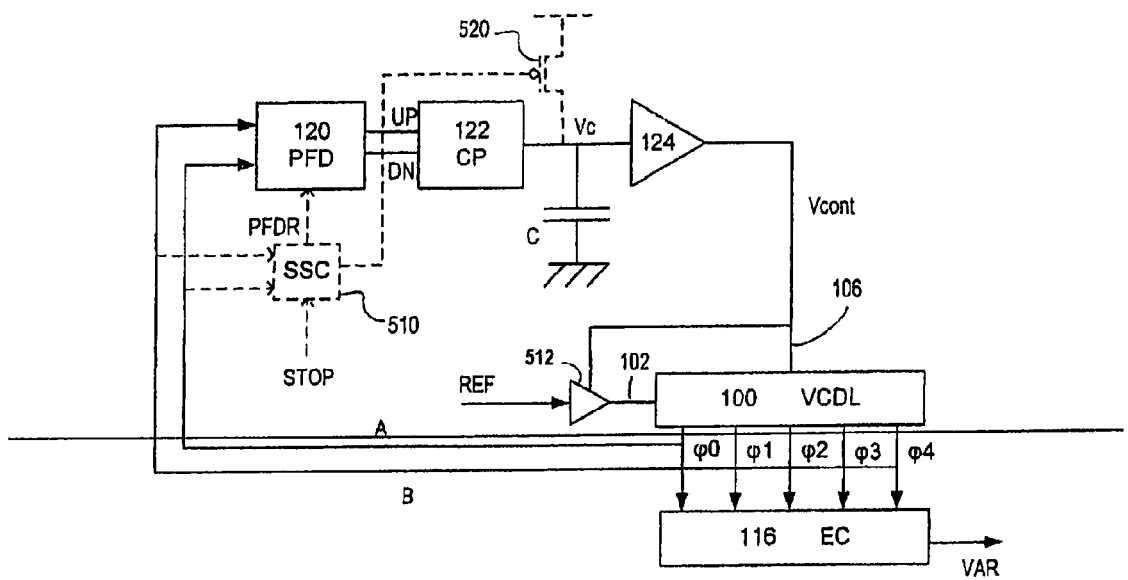
FIG. 5 shows a modified DLL circuit constituting a first embodiment of the present invention.

FIG. 5 shows a novel DLL which, by a very simple modification, eliminates the effect of additional delays, ensuring that the intermediate phase signals accurately subdivide the reference period $t_{ref}$. It will be seen that the basic arrangement and components 100-124 are the same as in the conventional circuit shown in FIG. 1. The key difference, however, is that the inputs to the phase frequency detector 120 are taken from intermediate phase outputs within the VCDL 100, namely φ0 and φ4. Hence the input clock period $t_{ref}$ becomes matched with the delay $N*t_d$ generated over just the phased outputs from the VCDL. The input and output buffer delays $t_a$ and $t_b$ are no longer in the loop, which results in more equal phase sub-division and the correct frequency output from the edge combiner.

The delay control signal $V_{cont}$ applied to VCDL 100 controls the stage delay $t_d$. To ensure an even delay is achieved across each of the delay elements it is shown that input buffer 512 is used which also has the control voltage $V_{cont}$ as its supply. Since this delay is outside the loop, this modification does not alter the running frequency or phase division of the DLL, which it would have done if applied to the conventional input buffer (112 in FIG. 1). This feature is optional and a normal buffer 112 could be used, at the risk of introducing some inequality in the phase division.

Stop/Start Control

Various elements are shown in broken lines in FIG. 5 to represent functions that can be added to ensure orderly stopping and starting of the DLL of FIG. 5. These are controlled by a run/stop signal STOP and stop/start control logic (SSC) 510. As is well known in the art, a conventional DLL will lock if the initial delay through the VCDL is greater than 0.5 $t_{ref}$ and less than 1.5 $t_{ref}$. This limits the range of $t_{ref}$ that the DLL can work with without additional circuitry. Some systems use additional feedback loops to vary the number of elements in the VCDL to control the delay on start-up. In this novel DLL we use a circuit that allows the initial delay on the VCDL to be both smaller than 0.5 $t_{ref}$ and greater than 1.5 $t_{ref}$ without needing to use additional loops.

There are two measures which combine to achieve this: a pre-charge phase where the control voltage $V_C$ is pumped to its maximum so as to minimise the delay setting upon start-up and a simple measure which ensures the correct edges are used for locking as described below.

A first function of the start-up circuitry is to prevent 'harmonic locking', in which a DLL with a wide range of delay variation locks to the reference signal with a wrong multiple of the clock frequency. This is achieved by starting the VCDL with a minimum delay to ensure that when the loop locks it does so with the lowest possible delay across the VCDL. Various circuits can be used to perform this action. In the example shown in FIG. 5, a transistor 520 is connected and controlled by a reset signal, so as to by-pass the charge pump and pre-charge the capacitor C to its maximum voltage $V_C$. (Alternatively, the UP signal from the PFD could be asserted for a relatively long time, thus causing the charge pump CP to charge the capacitor until the voltage $V_C$ is at a maximum.) This ensures that the loop starts with VCDL 100 imposing a minimum delay. The delay then grows as the feedback loop operates, until it matches $t_{ref}$. Lock might occur when the delay is actually say 4×, 3× or 2× $t_{ref}$ if the delay were started at a maximum instead. Although the design of the VCDL stages in this example means that minimum delay is achieved by maximum voltage $V_C$, the detailed implementation of the pre-setting function might be different with a different VCDL, or some driving arrangement other than a charge pump.

Figure 6:
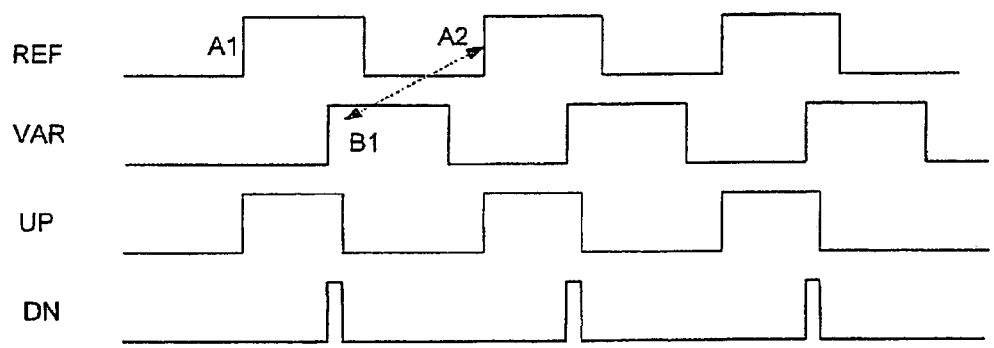
FIG. 6 shows waveforms in a start-up phase of operation of the DLL circuit, in conventional (a) and modified (b) versions of the circuit.

Referring also to the waveforms of FIGS. 6(a) and (b), another function of the start-up control logic 510 is to prevent so-called false locking in which PFD 120 'sees' the wrong edge as leading and drives the charge pump in the wrong direction indefinitely.

In FIG. 6(a) the waveforms labelled REF and VAR are the two inputs to the PFD, as shown in FIG. 5. Both inputs will start low (since B is just a delayed version of A, and we assume the clock stops low). The DLL should be trying to lock edge B1 to edge A2. In order to lock it needs to increase the delay in the loop by asserting DN far more than UP. However, because the delay is currently less than half its target value the phasing of the inputs is such that PFD 120 compares edges A1 and B1 instead, so that UP is asserted more than DOWN. This false locking problem is usually solved by requiring a specific clock phasing at input to the DLL or the ability to start the DLL with a known delay through the VCDL. Since the delay through the VCDL depends on the operating condition (temperature, process variation etc.) designing a VCDL with a known delay is very difficult.

Figure 6B:
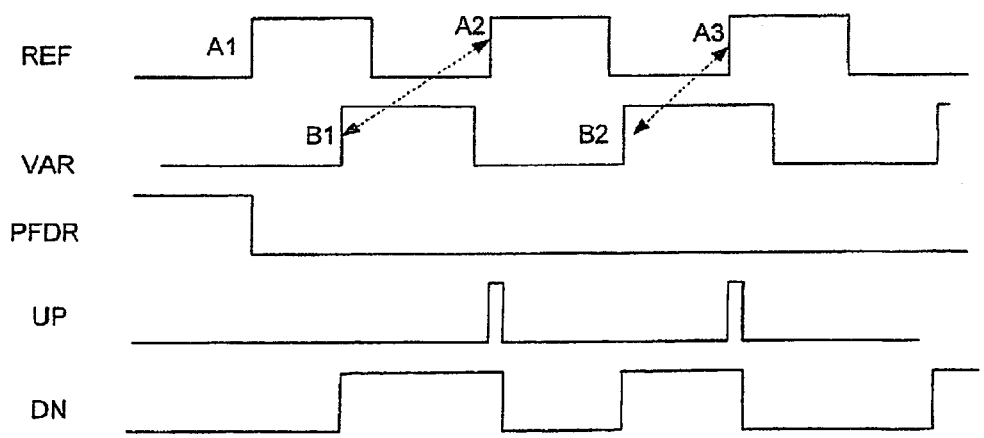

In the circuit of FIG. 5 false locking is eliminated via a reset signal PFDR which causes PFD 120 to ignore the first edge from the reference signal. FIG. 6(b) shows the effect of this. The PFD is held in reset until the first positive A edge (A1) occurs. Then when edge B1 is detected the DOWN output is correctly asserted and the delay in the DLL will increase so that edges B1 and A2, B2 and A3 etc. move together. The feedback loop continues driving in the right direction until eventually the edges B(n) and A(n+1) coincide exactly. This method assures the DLL will always. lock.

If this start-up method is used in conjunction with a pre-charge method then the DLL will never suffer from false or harmonic locking. Note that these techniques, represented for the sake of example only by the circuitry shown in broken lines in FIG. 5, are independent of the delay equalisation described with respect to FIGS. 4 and 5. They can thus be applied equally to the conventional DLL circuit of FIG. 1.

Interruption of Clocks

In some systems, as mentioned already, the clocks will be regularly stopped to reduce EMI and power consumption. Rather than requiring an external signal STOP as described above, VCDL 100 in the DLL can be used as a clock detector to manage operation should the clock go away.

Figure 7:
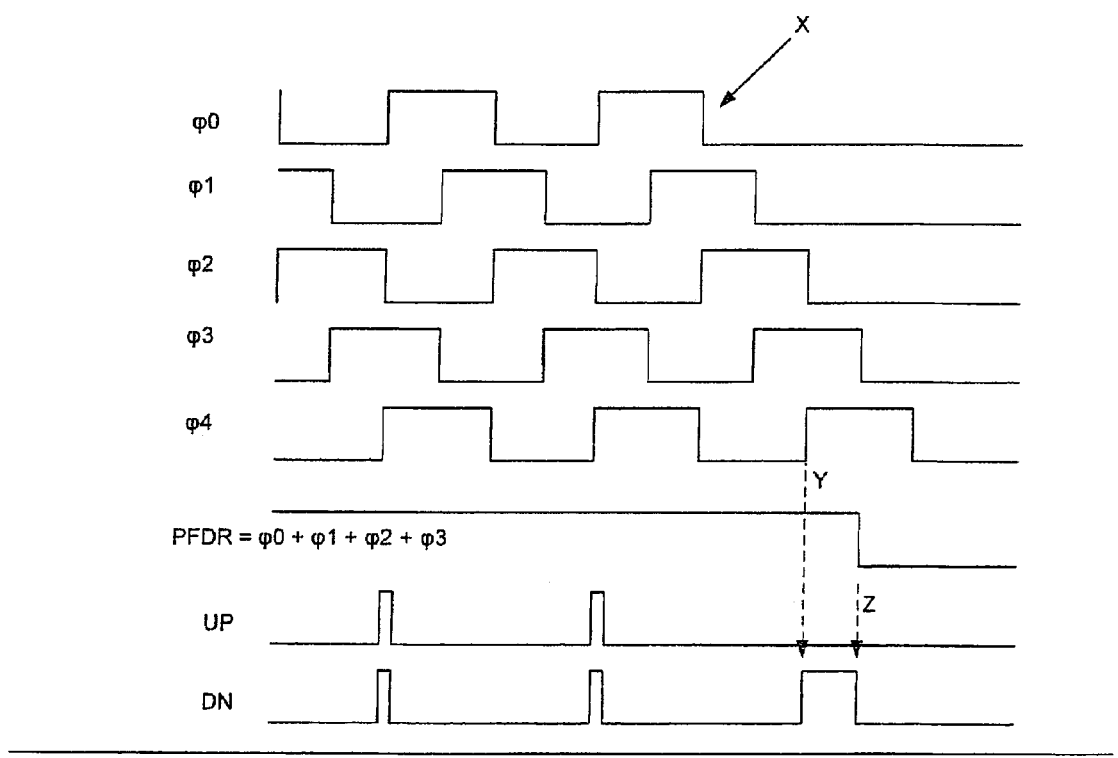
FIG. 7 shows waveforms in a stopping phase of operation of the DLL circuit.

FIG. 7 shows the principles of this detection operation, specifically the sequence of events after clock REF stops low. φ0 goes low first of all (at X), followed by φ1 and the others over time. Should all the phases in the VCDL be low (clocks stopped low) or high (clock stopped high) then it can be determined that the input clock has stopped. A flag signal is generated simply by OR-ing phases φ0 to φ3. This signal can be used as the run/stop signal STOP mentioned above, and the PFD reset signal PFDR can eb generated more or less directly from it. Whether the same signal controls directly the pre-charging transistor 520 depends on the situation.

In this example, the flag signal is used to reset the PFD, thus placing the charge pump outputs into a high impedance mode. In a first mode of operation, the signal to the bypass transistor 520 is suppressed, thus maintaining the voltage $V_C$ so that the recovery when the clock reappears is rapid. (There is one extra down pulse (between Y and Z as shown in FIG. 7) before the clock disappearance can be safely detected. This gives a small error in $V_C$, but the delay though the VCDL will still be close to that desired.) However, this mode of operation is only appropriate when it is known that the clock will restart at the same frequency as before, and the stoppage will be short enough to guarantee VCDL will not drift appreciably.

In another mode, desirable where the stoppage may be longer and/or the frequency of the reference clock may be different after the stoppage, the reset signal also operates the transistor 520 to force entry into the pre-charge phase described above. This ensures proper start-up irrespective of any drift or change in the reference frequency, at the expense of requiring somewhat longer for the DLL to properly settle when the clock re-appears. Needless to say, higher-level control circuitry can be programmed to determine on different occasions which mode of operation is needed.

CONCLUSION

The invention disclosed provides a different style of DLL which reduces the effects mentioned in the introduction to ensure that the clock produced is of a very high quality. Simulation results indicate that the conventional circuit can easily suffer from duty cycle distortion of 20% over temperature, process variation etc. This cannot easily be compensated by additional delay elements and similar methods, because the relationship between the delays $t_d$, $t_a$ and $t_b$ varies according to operating conditions such as temperature, supply voltage etc. In contrast, the FIG. 5 circuit removes the fundamental cause of this distortion, cutting this drastically independently of the operating conditions.

The start/stop functions to protect against false locking and harmonic locking serve to relax the design rules of the DLL markedly and eliminate more complex control circuitry. These functions can be used independently of the novel loop design, and hence applied to the FIG. 1 circuit as well as the novel circuit of FIG. 5.

The basic DLL will find a wide range of applications, according to the number of delay stages and the form of the edge combiner which synthesises the output waveform(s). In video applications, the DLL may be required to adapt its output to a wide range of frequencies, less so for audio. The reference frequency may be around 1 MHz-8 MHz, while the output frequency might be anything from 2× to 16× or more in practical applications. The circuit may be made re-configurable so as to vary the number of delay stages between taps, and/or to vary the logic functions within the edge combiner to generate different clock patterns at the output. Multiple phased signals can be derived easily from the basic set of intermediate phase waveforms φ0 to φN. The edge combiner (waveform synthesiser) may not be required at all if the desired output is simply delayed (for example, quadrature) copies of the input waveform.

Insisting on exactly matched paths for the signals derived from the outputs of the delay line is not necessarily essential, though desirable. For lower-performance applications, there would still be advantage in only loosely-matched paths (having, for example, different fan-outs), so long as their difference was better than a whole stage delay.

The form of VCDL stage used can change, as mentioned already above, and indeed the structure of the VCDL can change also. For example the stages can be made inverting or non-inverting, according to requirements, and the buffers shown schematically at 210-214 may in practice be integrated functionally with the delay stages. Inverting delay stages might comprise a single CMOS inverter rather than a pair of cascaded inverters for each stage. Differential stages could be implemented using well-known ECL (Emitter Coupled Logic) or SCL (Source-Coupled-Logic) controlled delay stages. The former would suffer some consistent delay mismatch between inverted and non-inverted delayed signals, but this could be tuned out to first order and would in any case be a lot less than the whole stage delay suffered by the original system, and the system might be able to run at twice the speed (frequency). For differential logic, one would not even suffer this mismatch.

Also one can compare one signal versus its inverse at the phase detector so that the system converges with total delay equal to half a reference signal period, rather than a full period. This is particularly easy in differential logic, where one can just swap inputs of one pair of inputs into a differential implementation version of the PFD, and not suffer the path delay of an actual extra inverting stage.

These and other modifications are possible within the spirit and scope of the invention as defined in the appended claims.

The invention claimed is:

1. A delay-locked loop (DLL) circuit having a reference signal input for receiving a periodic reference signal and at least two signal outputs for outputting respective output signals derived from the periodic reference signal and having a desired phase relationship with one another, the DLL circuit comprising:
   (a) a variable delay line comprising a plurality of nominally identical delay stages connected in series, the delay at each stage being adjustable in response to a delay control signal, the variable delay line including an input node of the first of said identical stages, one or more intermediate nodes at which an output of one of said identical stages is coupled to an input of a next stage, and an end node comprising an output of a last one of said identical stages in the variable delay line;
   (b) a delay line input path for feeding said periodic reference signal to an input node of the delay line;
   (c) a plurality of delay line output paths for deriving said output signals from respective ones of said nodes; and
   (d) a feedback control arrangement including a phase comparator and delay control signal generator for generating said delay control signal and applying it to the variable delay line such that a total delay over a number of said stages corresponds in a known manner to a period of the periodic reference signal,
   wherein the feedback control arrangement further comprises stop detection circuitry for detecting automatically interruptions in said periodic reference signal and interrupting feedback control of the variable delay line by the feedback control arrangement.

2. A circuit as claimed in claim 1 wherein said output paths include respective buffer circuits for deriving signals from said nodes as defined, while isolating said nodes from loading by inputs of circuits receiving said signals.

3. A circuit as claimed in claim 1, further comprising start-up control circuitry arranged to receive a pre-start signal and to modify the variable delay control signal so as to minimise the delay of the variable delay line prior to starting operation.

4. A circuit as claimed in claim 1, further comprising a waveform synthesiser for receiving said output signals having their predetermined phase relationship and for responding to transitions in said output signals to generate a synthesised periodic waveform with a frequency determined by said periodic reference signal.

5. A circuit as claimed in claim 1, wherein said signal outputs are connected to derive their respective output signals from respective ones of said nodes within said variable delay line, and wherein said phase comparator is arranged to receive and compare the phase of first and second differently delayed versions of the periodic reference signal which are both derived from respective nodes within the variable delay line separated only by a plurality of identical delay stages.

6. A circuit as claimed in claim 5 wherein the paths from the nodes providing the first and second delayed versions of the periodic reference signals are matched so that their delays are effectively cancelled and the variable delay line divides the reference period into equal intervals.

7. A circuit as claimed in claim 5 wherein the variable delay line input path comprises a delay line input buffer connected to receive said periodic reference signal and apply it to said variable delay line input node.

8. A circuit as claimed in claim 7 wherein the first delayed version of the periodic reference signal is derived from the variable delay line input node itself.

9. A circuit as claimed in claim 7 wherein the variable delay line input buffer comprises a variable delay stage similar to those within the variable delay line itself and connected to receive the same delay control signal.

10. A circuit as claimed in claim 5 wherein at least one of said output signals is derived via the same output path as one of the first and second delayed versions of the periodic reference signal.

11. A circuit as claimed in claim 5 wherein said outputs are derived via variable delay line output paths matched to the paths for the signals fed to the phase comparator.

12. A circuit as claimed in claim 5 further comprising start-up control circuitry arranged to cause said phase comparator to ignore a first transition in the first version of the periodic reference signal in determining a relative order of transitions in the first and second versions of the reference signal.

13. A circuit as claimed in claim 5, wherein the stop detection circuitry comprises a logic circuit combining a plurality of said output signals to generate a stop detection signal.

14. A circuit as claimed in claim 13, wherein the logic circuit comprises at least one OR gate for OR-ing the plurality of said output signals.

15. A circuit as claimed in claim 5, wherein the stop detection circuitry comprises means for maintaining said delay control signal when an interruption in said periodic reference signal has been detected.

16. A circuit as claimed in claim 5, wherein the stop detection circuitry comprises means for modifying the variable delay control signal so as to minimise the variable delay of the variable delay line prior to starting operation.

17. A circuit as claimed in claim 1, wherein the stop detection circuitry comprises a logic circuit combining a plurality of said output signals to generate a stop detection signal.

18. A circuit as claimed in claim 17, wherein the logic circuit comprises at least one OR gate for OR-ing the plurality of said output signals.

19. A circuit as claimed in claim 1, wherein the stop detection circuitry comprises means for maintaining said delay control signal when an interruption in said periodic reference signal has been detected.

20. A circuit as claimed in claim 1, wherein the stop detection circuitry comprises means for modifying the delay control signal so as to minimise the delay of the variable delay line prior to starting operation.

21. A method of operating a delay-locked loop (DLL) circuit, the method comprising:
(a) providing a variable delay line comprising a plurality of nominally identical delay stages connected in series, the delay at each stage being adjustable, the variable delay line including an input node of a first of said identical stages, one or more intermediate nodes at which an output of one of said identical stages is coupled to an input of a next stage, and an end node comprising an output of a last one of said identical stages in the variable delay line;
(b) receiving a periodic reference signal and feeding said periodic reference signal via a delay line input path to the input node of the variable delay line;
(c) deriving from respective ones of said nodes a plurality of output signals having a desired phase relationship with one another;
(d) controlling the delays of the stages within the variable delay line automatically such that a total delay over a number of said stages corresponds in a known manner to a period of the periodic reference signal; and
(e) detecting automatically interruptions in said periodic reference signal and interrupting feedback control of the variable delay line by the feedback control arrangement.

22. A method as claimed in claim 21 wherein said output signals are derived via respective buffer circuits for isolating said nodes from loading by inputs of circuits receiving said signals.

23. A method as claimed in claim 21 further comprising minimising the delay of the variable delay line prior to starting operation of said controlling step (c).

24. A method as claimed in claim 21, further comprising a step of receiving said output signals having their predetermined phase relationship and responding to transitions in said output signals to generate a synthesised periodic waveform with a frequency determined by said periodic reference signal.

25. A method as claimed in claim 21, wherein said controlling step (d) is performed by comparing the phase of first and second differently delayed versions of the periodic reference signal which are both derived via respective output paths from respective nodes within the variable delay line, said nodes being separated only by a plurality of identical delay stages.

26. A method as claimed in claim 25 wherein the first and second delayed versions of the reference signals are derived via matched paths so that their delays are effectively cancelled and the variable delay line divides the reference period into equal intervals.

27. A method as claimed in claim 25 wherein said periodic reference signal is applied to said variable delay line input node via a delay line input path comprising a delay line input buffer.

28. A method as claimed in claim 27 wherein the first delayed version of the periodic reference signal is derived from the variable delay line input node itself.

29. A method as claimed in claim 27 wherein the delay line input buffer comprises a variable delay stage similar to those within the variable delay line itself and controlled in unison with those other stages.

30. A method as claimed in claim 25 wherein at least one of said output signals is derived via the same output path as one of the first and second delayed versions of the periodic reference signal.

31. A method as claimed in claim 25 further comprising causing a phase comparator to ignore a first transition in the first version of the periodic reference signal in determining the relative order of transitions in the first and second versions of the periodic reference signal at the start of said controlling step (c).

32. A method as claimed in claim 25, wherein step (e) comprises logically combining a plurality of said output signals to generate a stop detection signal.

33. A method as claimed in claim 32, wherein step (e) comprises OR-ing a plurality of said output signals to generate the stop detection signal.

34. A method as claimed in claim 25, wherein step (e) comprises maintaining said delay control signal when an interruption in said periodic reference signal has been detected.

35. A method as claimed in claim 25, wherein step (e) comprises modifying a delay control signal so as to minimise the delay of the variable delay line prior to starting operation.

36. A method as claimed in claim 21, wherein step (e) comprises logically combining a plurality of said output signals to generate a stop detection signal.

37. A method as claimed in claim 36, wherein step (e) comprises OR-ing a plurality of said output signals to generate the stop detection signal.

38. A method as claimed in claim 21, wherein step (e) comprises maintaining a said delay control signal when an interruption in said periodic reference signal has been detected.

39. A method as claimed in claim 21, wherein step (e) comprises modifying a delay control signal so as to minimise the delay of the variable delay line prior to starting operation.

* * * * *